United States Patent
Re et al.

(10) Patent No.: US 6,261,916 B1
(45) Date of Patent: *Jul. 17, 2001

(54) PROCESS FOR FABRICATING INTEGRATED MULTI-CRYSTAL SILICON RESISTORS IN MOS TECHNOLOGY, AND INTEGRATED MOS DEVICE COMPRISING MULTI-CRYSTAL SILICON RESISTORS

(75) Inventors: Danilo Re, Bernareggio; Massimo Monselice, Offanengo; Paola Maria Granatieri, Milan, all of (IT)

(73) Assignee: STMicroelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,909

(22) Filed: Dec. 11, 1998

(30) Foreign Application Priority Data

Dec. 12, 1997 (EP) .................................................. 97830663

(51) Int. Cl.⁷ ........................ H01L 21/283; H01L 21/336
(52) U.S. Cl. ............................ 438/385; 438/238; 438/592
(58) Field of Search .................................. 438/238, 385, 438/592, FOR 207, FOR 220

(56) References Cited

U.S. PATENT DOCUMENTS

| 4,290,185 | 9/1981 | McKenny et al. ............ 29/571 |
| 5,013,678 | 5/1991 | Winnerl et al. ............. 437/52 |
| 5,185,285 | 2/1993 | Hasaka .................... 437/60 |
| 5,391,906 | 2/1995 | Natsume .................. 257/379 |
| 5,554,873 | 9/1996 | Erdeljac et al. ........... 257/380 |
| 5,780,349 | * 7/1998 | Naem . |
| 5,904,512 | * 5/1999 | Chang et al. . |
| 5,970,338 | * 10/1999 | Tempel . |

FOREIGN PATENT DOCUMENTS

0272433A2   6/1988  (EP) .

* cited by examiner

*Primary Examiner*—George Fourson
*Assistant Examiner*—Joannie A. Garcia
(74) *Attorney, Agent, or Firm*—Theodore E. Galanthay; E. Russell Tarleton; Seed IP Law Group PLLC

(57) ABSTRACT

A fabrication process and an integrated MOS device having multi-crystal silicon resisters are described. The process includes depositing a multi-crystal silicon layer on top of a single-crystal silicon body; forming silicon oxide regions on top of the multi-crystal silicon layer in zones where resistors are to be produced; depositing a metal silicide layer on top of and in contact with the multi-crystal silicon layer so as to form a double conductive layer; and shaping the conductive layer to form gate regions, of MOS transistors. During etching of the double conductive layer, the metal silicide layer on top of the silicon oxide regions is removed and the silicon oxide regions form masking regions for the multi-crystal silicon underneath, so as to form resistive regions having a greater resistivity than the gate regions.

17 Claims, 2 Drawing Sheets

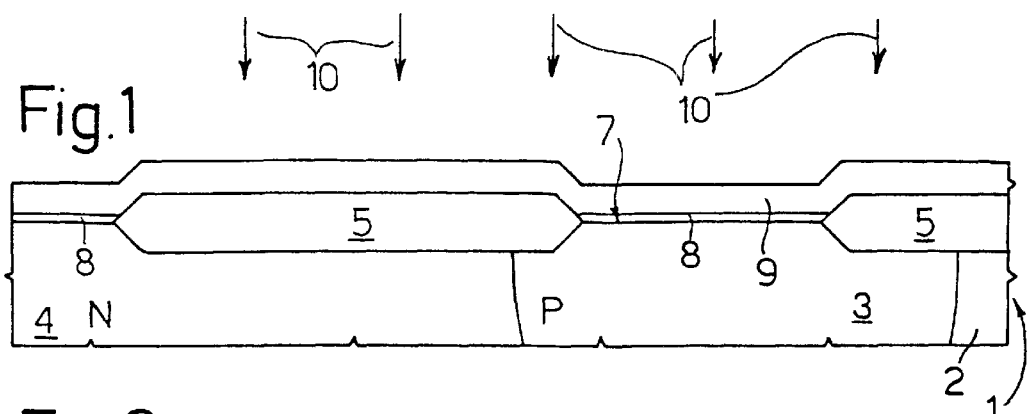
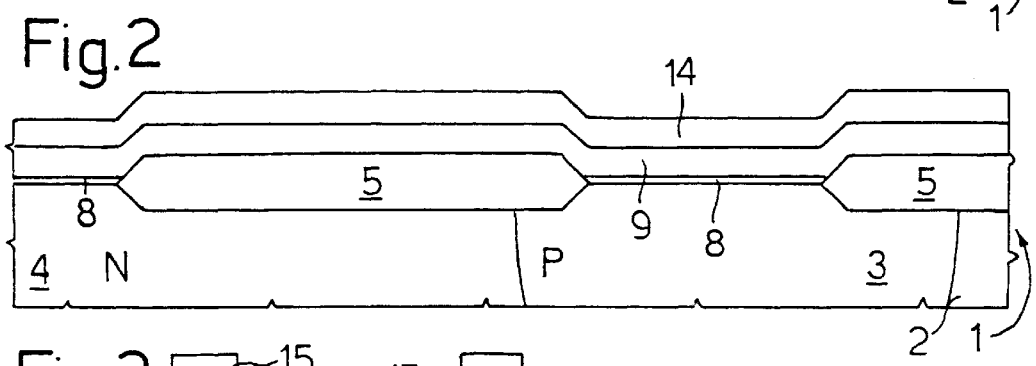
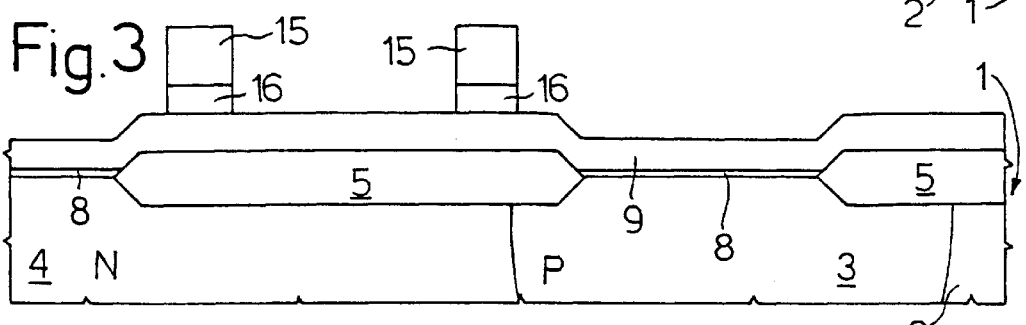
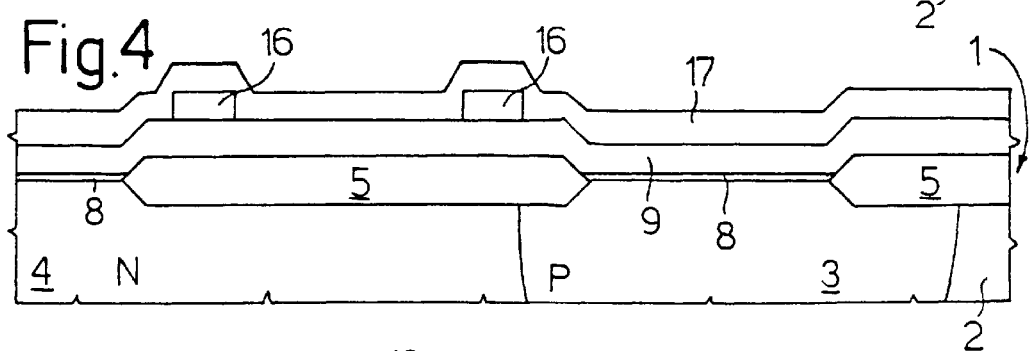
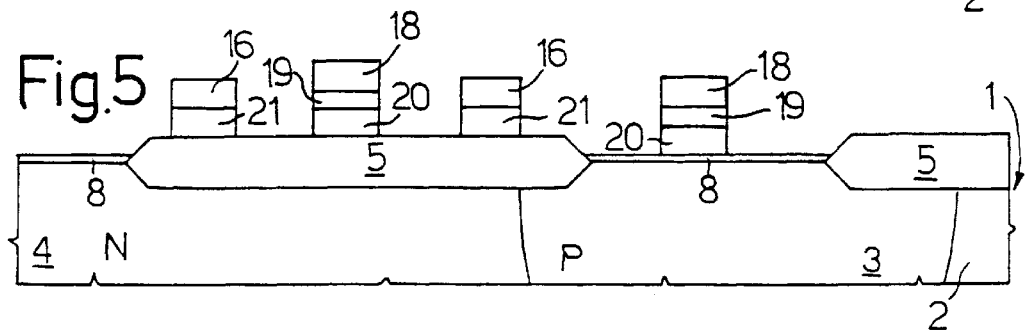

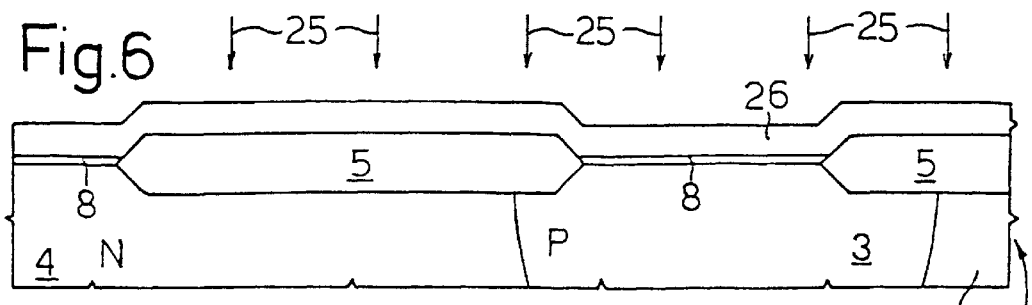
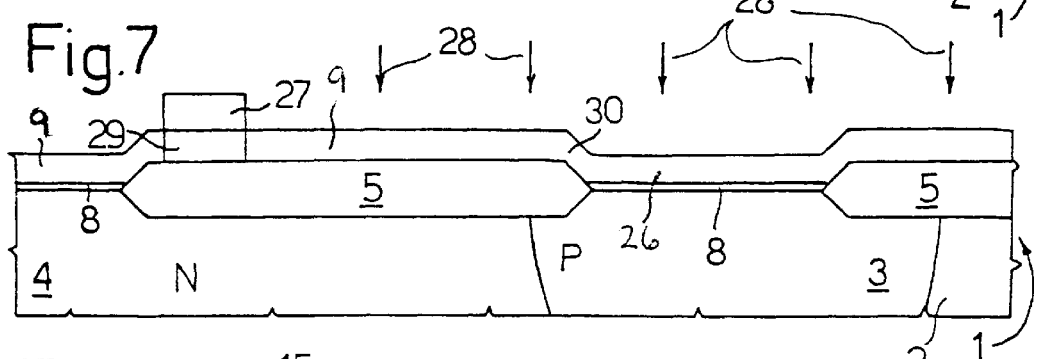
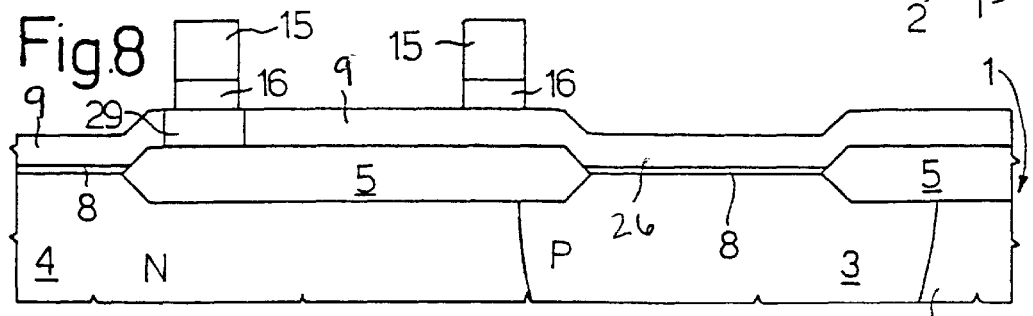
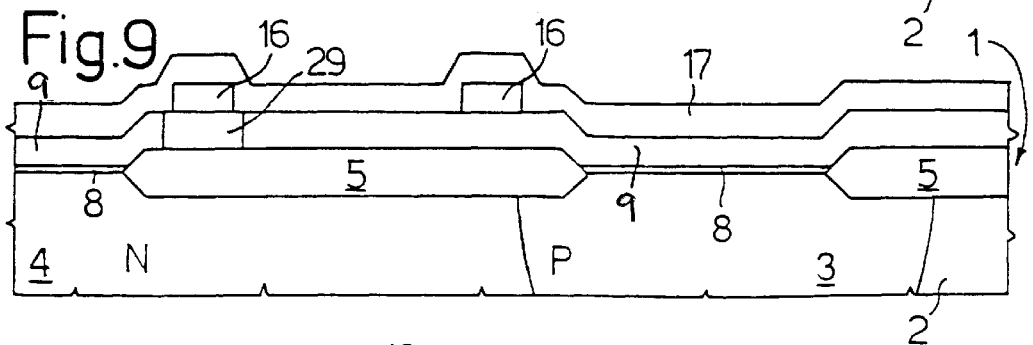
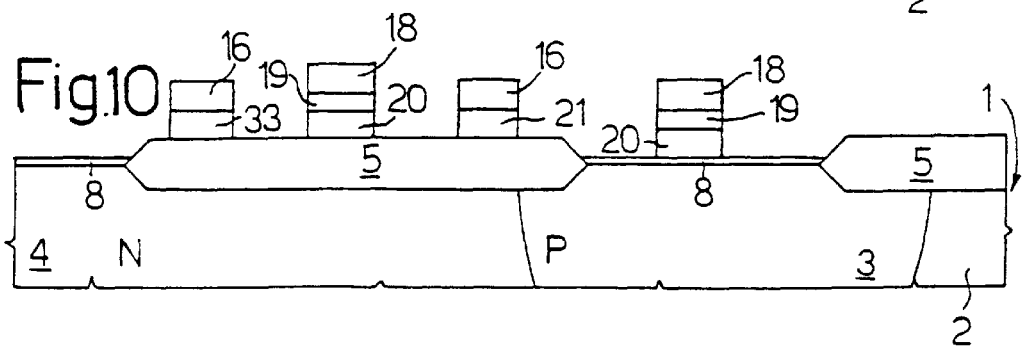

PROCESS FOR FABRICATING INTEGRATED MULTI-CRYSTAL SILICON RESISTORS IN MOS TECHNOLOGY, AND INTEGRATED MOS DEVICE COMPRISING MULTI-CRYSTAL SILICON RESISTORS

TECHNICAL FIELD

The invention relates generally to integrated circuits and their fabrication, and more particularly to a process for fabricating integrated resistors of multi-crystal silicon in MOS technology and an integrated MOS device comprising multi-crystal silicon resistors.

BACKGROUND OF THE INVENTION

CMOS technologies are known in which a silicide layer of low resistivity is used to form the gate electrodes of transistors. With these technologies there is the problem of also integrating resistive components of multi-crystal silicon (polysilicon) which may have resistivity values higher than those of the gate electrodes by one or more orders of magnitude.

In particular, this problem arises when, together with logic functions with high switching speed (devices operating at frequencies of the order of several tens of MHz or more), it is necessary also to integrate analog functions which often require multi-crystal silicon resistors with higher resistivity values (typically >20–200 Ohms/square or even of the order of several KOhms/square in particular applications).

For example, in case of ADC converters in which voltage dividers are required having good linearity properties and not too demanding from the point of view of the space occupied in the layout, manufacturing of multi-crystal silicon resistors is often regarded as the best; on the other hand this technique is not applicable to processes for digital devices, where the low resistance of signal lines is an important requirement.

The technological difficulties of such integration are well understood given the process flow and the architecture of a typical CMOS process using silicide gate electrodes. As is well known, the material of the gate lines is a composite material obtained by superimposing a high-resistivity (typically 20–200 Ohms/square) multi-crystal silicon layer and a silicide layer of a metal which generally has a low resistivity value (such as tungsten silicide with a resistivity equal to approximately 5 Ohms/square). Since this composite material is shaped by a single masking step, it is currently impossible to distinguish the two layers and the resistive components which can be obtained inevitably have the low resistivity value of the composite material.

The above-mentioned difficulties are still greater where resistors of very high value (e.g., between 10 and 100 KOhms) are to be integrated. In view of the stringent linearity and accuracy requirements, these components would have to be produced through long multi-crystal silicon strips and would require considerable space in the layout. To remedy this disadvantage it is known to manufacture resistors, in addition to those normally available in a CMOS process, of multi-crystal silicon with resistivity of the order of several KOhms/square. At the present time, such high-value resistors are integrated using a specific polysilicon masking and subsequent doping step before defining the gate lines, so as to locally shield normal doping (with $POCl_3$ or implant) and leaving such areas with the concentration of dopant previously received through a suitable ion implantation step. In this way, multi-crystal silicon strips for the gate lines with a resistivity of the order of tens of Ohms/ square together with resistors strips with resistivity of the order of several KOhms/square can be obtained at the same time by the known process.

For the reasons outlined above, this process is entirely incompatible with a MOS process using a silicide layer and constitutes a limit to optimization of the design of devices in terms of both performance and dimensions.

SUMMARY OF THE INVENTION

In accordance with the present invention, a process is provided for fabricating integrated multi-crystal silicon resistors in a MOS device. The process includes depositing a multi-crystal silicon layer on a single-crystal silicon body. The multi-crystal silicon is doped a first time, and selective portions of the multi-crystal silicon are then masked. The multi-crystal silicon is then doped a second time, with the selective portions then having a conductivity lower than adjacent portions of the multi-crystal silicon. Masking regions are then formed on the multi-crystal silicon layer prior to forming a metal silicide layer on and in contact with the multi-crystal silicon layer. The metal silicide layer and multi-crystal silicon layer then form a double conductive layer which is etched to form gate regions.

In accordance with the process of the present invention, an integrated MOS device is produced that includes a gate region having a first resistivity, a first resistive element having a second resistivity, and a second resistive element having a third resistivity. The third resistivity is greater than the second resistivity, which in turn is greater than the first resistivity.

One advantage of the invention is that both low-resistivity gate lines and multi-crystal silicon resistive components with higher resistivity values can be readily provided in MOS integrated devices.

BRIEF DESCRIPTION OF THE DRAWINGS

For an understanding of the invention, two preferred embodiments will now be described, purely by way of non-exhaustive example, with reference to the accompanying drawings.

FIGS. 1–5 show cross-sections through a semiconductor material wafer in successive manufacturing steps, according to a first embodiment of the invention.

FIGS. 6–10 show cross-sections through a semiconductor material wafer in successive manufacturing steps, according to a second embodiment of the invention.

DETAILED DESCRIPTION OF 1THE INVENTION

A first embodiment of the process relating to the manufacture of resistors with medium-high resistance (e.g., $\leq 1$ KOhm) will be described below with reference to FIGS. 1–5.

In detail, FIG. 1 shows a cross-section of a silicon wafer 1 comprising a substrate 2, already subjected to the preliminary manufacturing steps according to a CMOS process. In particular, P-type and N-type wells have been formed in substrate 2 (P-well and N-well denoted by 3 and 4 in FIG. 1); the active areas have been defined; field oxide regions 5 have been grown; a gate oxide layer 8 has been grown on the surface 7 of the wafer 1, and a multi-crystal silicon layer has been deposited thereon. The multi-crystal silicon layer is then doped, as shown by arrows 10 in FIG. 1 and by analogy with the known process; doping may be carried out either with normal treatments in doping furnaces (in which the silicon is typically doped with phosphorus obtained by dissociation of the molecule of POCl3 in the presence of O2), or with ion implantation techniques. In known manner, doping parameters may be regulated so as to provide resistivity values of 20–400 Ohms/square, preferably of 30–200 Ohms/square, or other suitable resistivity values according to the requirements of particular design specifications. Inter alia, this resistivity is suitable for producing resistors with medium-low values mentioned. The intermediate structure of FIG. 1, in which the doped multi-crystal layer is denoted by 9, is thus obtained.

After doping, a silicon oxide layer 14 (FIG. 2) is deposited, preferably by chemical vapor deposition (CVD); a mask 15 (FIG. 3) is then produced, having portions covering the silicon oxide layer 14, the shape and geometrical dimensions (width and length) of which correspond to those of the resistors to be produced. Using this mask 15, the uncovered portions of the silicon oxide layer 14 are removed, obtaining the structure of FIG. 3 in which the remaining portions of the layer 14 are denoted by 16.

After removal of mask 15, a silicide layer 17 (FIG. 4) is deposited and a mask 18 formed to define the transistor gate regions (FIG. 5). Then, using mask 18, the uncovered portions of silicide layer 17 and of polysilicon layer 9 are etched and removed. In view of the high etching selectivity silicide/polysilicon with respect to silicon oxide, this etching enables the double layer 9+17 at the sides of the transistors gate regions and the silicide layer 17 on top of the oxide portions to be removed, leaving areas of multi-crystal silicon covered by the oxide portions 16 unchanged. The structure of FIG. 5 is thus obtained, wherein the portions of the layers 17 and 9 forming the transistor gate regions (in active area) and low-resistivity interconnection structures (extending on top of field oxide regions 5) are denoted by 19 and 20 and the portions of the doped multi-crystal layer 9 beneath oxide portions 16 are denoted by 21. Portions 21 (arranged on top of field oxide regions 5) form the desired resistors with medium-high resistance.

Subsequently the process continues with conventional steps for manufacturing CMOS transistors including doping source and drain areas of the transistors, depositing an insulating dielectric layer; opening contacts both in the areas of standard components and on the terminal parts of the resistors 21 and the successive steps form forming the metallic interconnections, passivation etc.

A second embodiment of the process relating to the manufacture of resistors with high-value resistivity (e.g., >1 KOhm) will now be described with reference to FIGS. 6–10. In FIGS. 6–10 the parts similar to the first embodiment according to FIGS. 1–5 have been denoted by the same reference numbers.

The manufacturing process according to the second embodiment begins with the same process steps described above, as far as deposition of multi-crystal silicon layer. Subsequently, multi-crystal silicon layer is subjected to a blanket boron implantation step (with a concentration of $10^{14}$ at/cm$^2$ for example), as indicated in FIG. 6 by arrows 25; a doped layer 26 with a resistivity between 500 Ohms/square and 3 KOhms/square inclusive, typically 2 KOhms/square, is thus obtained. Of course, those skilled in the art understand that a variety of doping concentrations may be employed, and a corresponding variety of resistivity values achieved, as suitable to particular integrated circuit designs and associated processes.

Doped layer 26 is then masked by means of a mask 27 which covers the areas in which the high-value resistors are to be produced, and an N+-type doping step is carried out (indicated in FIG. 7 by arrows 28) similar to the doping step described with reference to FIG. 1 and having, inier alia, the purpose of compensating P-type doping carried out previously. The structure of FIG. 7 is thus obtained, in which the portion of doped layer 26 covered by mask 27 is not influenced by doping 28 and forms a low-doping region 29; the remainder of layer 26, not covered by mask 27, forms a layer again denoted by 9 by analogy with the preceding embodiment.

Subsequently, and by analogy with the above, an oxide layer is deposited, masked (mask 15) and etched, leaving only the portions 16 which define the resistors, some of which have a lateral extent less than and contained within the lateral extent of the low-doping region 29 (ie., having slightly smaller area, as shown in FIG. 8). Silicide layer 17 is then deposited (FIG. 9); mask 18 is formed; and double layer 17+9 is etched where exposed. By analogy with FIG. 5, the zones of double layer 17+9 covered by mask 18 give rise to low-resistivity portions 19, 20 and the zone of layer 9 beneath oxide portion 16 (masked by the latter) gives rise to a portion 21 defining a resistor of medium-high resistivity, as described below. Furthermore, the portion of region 29 underneath oxide portion 16 forms a region 33 having the same doping as region 29 but of slightly smaller dimensions. Region 33 thus forms a resistor of high resistance (e.g., >1 KOhm, up to several hundred KOhms).

Conventional final steps, already referred to above, then follow. The resulting structure thus comprises both a resistor of medium-high value (formed by region 21) and a resistor of high value (formed by region 33).

The advantages of the described process are as follows. Firstly, it enables resistive components to be produced with a higher value than that of current CMOS fabrication processes, providing gate regions including a silicide layer, with dimensions and layout which are acceptable in the micro-electronics field, thus increasing the range of components available to designer in CMOS technology, without altering the performance of the other components and hence reliability of the integrated device.

The process only requires the addition of a number of simple technological steps which do not introduce significant difficulties into production control, and do not involve high costs. In particular, as it does not require heat treatments other than CVD deposition and etching of the silicon oxide layer the process may be adopted without interfering with standard CMOS fabrication processes.

Finally it will be clear that numerous modifications and variants may be introduced to the method described and illustrated herein, all of which come within the scope of the invention as described in the accompanying claims. For example, for both the embodiments described above, instead of by direct deposition, silicide layer 17 may be obtained by depositing a metal layer (titanium) and causing the metal to react with the silicon by a chemical reaction activated by an RTA Rapid Thermal Annealing) treatment, similar to current practice with salicization processes carried out in a successive step of the manufacturing process, after the source and drain junctions have been produced.

Obtaining the silicide layer in the above manner has the advantage of exploiting the selectivity of the chemical reaction generating titanium silicide, which does not take place in the presence of oxide. In this way, the absence of silicide on the areas covered with oxide also prevents possible delamination effects which could occur if a deposition step were used, as described with reference to FIGS.

4 and 9. In this case, otherwise, the chemical reaction which forms compound TiSi$_2$ provides for a heat treatment which may cause modifications to some junction profiles already present in this step; on the other hand, such modifications may easily be recovered with slight corrections to the ion implantation doping steps.

It will be appreciated that, although specific embodiments of the invention have been described for purposes of illustration, various modifications may be made without deviating from the spirit and scope of the invention. For example, the above-described doping concentrations, resistivity values, resistance values, and particular process flow details may well vary depending upon particular integrated circuit designs and associated fabrication processes. Accordingly, the invention is not limited by the particular disclosure above, but instead the scope of the invention is determined by the following claims.

What is claimed is:

1. A process for manufacturing multi-crystal silicon integrated resistors in MOS technology, comprising the steps of:
    forming a multi-crystal silicon layer on a single-crystal silicon body and insulated therefrom by insulating regions, including the steps of:
    depositing multi-crystal silicon on the insulating regions;
    first doping of said multi-crystal silicon;
    masking selective portions of said multi-crystal silicon with a doping mask; and
    second doping of said multi-crystal silicon, said selective portions having, after said second doping, a conductivity lower than adjacent portions of said multi-crystal silicon;
    forming masking regions on the multi-crystal silicon layer;
    forming a metal silicide layer on and in contact with said multi-crystal silicon layer so as to form a double conductive layer; and
    etching said double conductive layer to form gate regions, the masking regions being of material resistant to the etching of said double conductive layer, and the portions of said multi-crystal silicon layer masked by said masking regions thereby forming resistive regions that are isolated from the double conductive layer and having a resistivity greater than said gate regions.

2. A process according to claim 1 wherein said insulating regions comprise silicon oxide.

3. A process according to claim 1 wherein the insulating regions include field isolating regions, and wherein said resistive regions are formed on said field isolating regions.

4. A process according to claim 1 wherein said step of forming masking regions comprises the step of depositing an insulating layer by CVD and patterning said insulating layer.

5. A process according to claim 1 wherein said resistive regions have a resistivity between 20 and 400 Ohms/square.

6. A process according to claim 1 wherein said selective portions have a resistivity between 500 and 3000 Ohms/square.

7. A process according to claim 1, further comprising the step of removing said doping mask after said first doping, and wherein said masking regions are formed on said selective portions.

8. A process according to claim 7 wherein the lateral extent of said masking regions is less than and contained within the lateral extent of the selective portions.

9. A process according to claim 1 wherein said step of forming a metal silicide layer is carried out by deposition of metal silicide.

10. A process according to claim 1 wherein said step of forming a metal silicide layer comprises the steps of depositing a metal material and causing said metal material to react chemically with said multi-crystal silicon layer by a heat treatment.

11. A method of fabricating an integrated circuit including a field-effect transistor and first and second resistors on a semiconductor substrate, the method comprising:
    forming an insulation region on the substrate;
    forming a polycrystalline semiconductor layer on the insulation region;
    doping the polycrystalline semiconductor layer, the polycrystalline semiconductor layer thereby having a first resistivity;
    masking a first portion of the polycrystalline semiconductor layer;
    doping a second portion and third portion of the polycrystalline semiconductor layer, the second portion of the polycrystalline semiconductor layer thereby having a second resistivity, the second resistivity being less than the first resistivity;
    masking the first and second portions of the polycrystalline semiconductor layer, leaving exposed the third portion of the polycrystalline semiconductor layer;
    forming a conducting layer on the third portion of the polycrystalline semiconductor layer and on the masked first and second portions of the polycrystalline semiconductor, thereby forming a double conductive layer comprising the conducting layer and the third portion of the polycrystalline semiconductor layer, the double conductive layer having a third resistivity less than the second resistivity; and
    selectively etching the double conductive layer to form a gate region of the field-effect transistor and to form resistive regions of the first and second resistors that are isolated from the conducting layer.

12. The method of claim 11 wherein forming the insulation region includes forming a field isolation region and forming a gate insulation layer, the first and second portions of the polycrystalline semiconductor layer being separated from the substrate by the field isolation region, and the gate region being separated from the substrate by the gate insulation layer.

13. The method of claim 11 wherein forming the conducting layer on the third portion of the polycrystaline semiconductor layer includes:
    masking the first and second portions of the polycrystalline semiconductor layer, leaving exposed the third portion of the polycrystalline semiconductor layer; and
    depositing metal on the third portion of the polycrystalline semiconductor layer and on the masked first and second portions of the polycrystalline semiconductor layer.

14. The method of claim 11 wherein forming the polycrystalline semiconductor layer includes forming a polysilicon layer, and wherein forming the conducting layer includes forming a metal silicide layer.

15. A process for manufacturing multi-crystal silicon integrated resistors in MOS technology, comprising:
    forming a multi-crystal silicon layer on a single-crystal silicon body and insulated therefrom by insulating regions, including the steps of:
    depositing multi-crystal silicon on the insulating regions;
    first doping of said multi-crystal silicon;
    masking selective portions of said multi-crystal silicon with a doping mask; and second doping of said multi-crystal silicon, said selective portions having, after said second doping, a conductivity lower than adjacent portions of said multi-crystal silicon;

forming an oxide layer on top of the multi-crystal silicon;

forming photo-resist masks having a selected shape on the oxide layer;

etching the oxide layer to remove oxide material not covered by the photo-resist mask thereby obtaining an oxide mask of the remaining portion of the layer;

forming a metal silicide layer on and in contact with said multi-crystal silicon layer so as to form a double conductive layer; and etching said double conductive layer to form gate regions, the masking regions being of material resistant to the etching of said double conductive layer, and the portions of said multi-crystal silicon layer masked by said oxide masking regions thereby forming resistive regions that are isolated from the double conductive layer and that have a resistivity greater than said gate regions.

16. The process of claim 15 wherein the lateral extent of said photo-resist mask is less than and contained within the lateral extent of the selective portions.

17. A process for manufacturing multi-crystal silicon integrated resistors in MOS technology, comprising:

producing a high precision integrated resistor, comprising:

forming a multi-crystal silicon layer on a single-crystal silicon body and insulated therefrom by insulating regions, including the steps of:

depositing multi-crystal silicon on the insulating regions;

first doping of said multi-crystal silicon;

masking selective portions of said multi-crystal silicon with a doping mask; and second doping of said multi-crystal silicon, said selective portions having, after said second doping, a conductivity lower than adjacent portions of said multi-crystal silicon;

forming an oxide layer on top of the multi-crystal silicon;

forming photo-resist masks having a selected shape on the oxide layer;

etching the oxide layer to remove oxide material not covered by the photo-resist mask thereby obtaining an oxide mask of the remaining portion of the layer;

forming a metal silicide layer on and in contact with said multi-crystal silicon layer so as to form a double conductive layer; and etching said double conductive layer to form gate regions, the masking regions being of material resistant to the etching of said double conductive layer, and the portions of said multi-crystal silicon layer masked by said oxide masking regions thereby forming resistive regions having a resistivity greater than said gate regions.

* * * * *